US010458630B2

(12) United States Patent
Wiegel et al.

(10) Patent No.: US 10,458,630 B2
(45) Date of Patent: Oct. 29, 2019

(54) LANTERN WITH REMOVABLE SHADE

(71) Applicants: Stephanie E. Wiegel, Evanston, IL (US); Tyler J. Kaschke, Evanston, IL (US)

(72) Inventors: Stephanie E. Wiegel, Evanston, IL (US); Tyler J. Kaschke, Evanston, IL (US)

( * ) Notice: Subject to any disclaimer, the term of this patent is extended or adjusted under 35 U.S.C. 154(b) by 115 days.

(21) Appl. No.: 15/653,002

(22) Filed: Jul. 18, 2017

(65) Prior Publication Data

US 2018/0187869 A1 Jul. 5, 2018

Related U.S. Application Data

(60) Provisional application No. 62/441,509, filed on Jan. 2, 2017.

(51) Int. Cl.

| | |
|---|---|
| ***G01R 31/28*** | (2006.01) |
| ***G01R 27/08*** | (2006.01) |
| ***G01R 31/3183*** | (2006.01) |
| ***G01B 7/16*** | (2006.01) |
| ***F21V 21/084*** | (2006.01) |
| ***F21V 1/06*** | (2006.01) |
| ***F21V 17/10*** | (2006.01) |
| ***F21V 17/00*** | (2006.01) |
| *F21V 7/22* | (2018.01) |
| *F21V 9/30* | (2018.01) |
| *F21V 7/04* | (2006.01) |

(52) U.S. Cl.

CPC .............. *F21V 21/084* (2013.01); *F21V 1/06* (2013.01); *F21V 17/007* (2013.01); *F21V 17/105* (2013.01); *F21V 7/04* (2013.01); *F21V 7/22* (2013.01); *F21V 9/30* (2018.02)

(58) Field of Classification Search

CPC . F21V 21/084; F21V 1/06; F21V 7/22; F21V 9/16; F21V 17/105

See application file for complete search history.

(56) References Cited

U.S. PATENT DOCUMENTS

| | | | | |
|---|---|---|---|---|
| 10,203,099 | B1 * | 2/2019 | McCann | F21V 1/18 |
| 10,214,361 | B2 * | 2/2019 | Kaeb | B65G 21/08 |
| 2012/0320606 | A1 * | 12/2012 | Vossoughi | F21V 1/00 362/351 |
| 2016/0091184 | A1 * | 3/2016 | Ng | A45F 3/20 362/101 |

* cited by examiner

*Primary Examiner* — Joseph L Williams

(74) *Attorney, Agent, or Firm* — Quarles & Brady LLP

(57) ABSTRACT

A lantern system is disclosed. The lantern system can include a lantern base and a lantern shade. The lantern shade can have at least one side wall and a fastener. The at least one side wall can have at least one portion with light diffusing properties and at least one portion with light concentrating properties. The lantern shade can be removably coupled the base via the fastener. The lantern base can include at least one leg to attach a strap of a headlamp to the lantern base.

19 Claims, 4 Drawing Sheets

LANTERN WITH REMOVABLE SHADE

CROSS-REFERENCES TO RELATED APPLICATIONS

The present application claims the benefit of U.S. Provisional Application Ser. No. 62/441,509, filed on Jan. 2, 2017 and entitled "Headlamp Lantern Illumination System and Associated Methods."

BACKGROUND

Weight, physical volume, and battery life are limiting factors when deciding what illumination sources to bring camping. Campers who carry their supplies into wilderness areas often forgo bringing a lantern because they are too big, too heavy, and/or too battery inefficient. This leaves campers with only the light from their headlamps, which are good for individual close-up activities, but not suitable for social or extended lighting. Campers have found ways to hack this problem by strapping their headlamp to a gallon of water or placing a halved ping pong ball over their headlamp to transform the spotty light from their headlamp into softer, more diffuse light. However, these solutions can diffuse light too much, making the lantern dimmer than desired.

Some campers utilize more than one headlamp as a light source to assist with the problem of dim lantern light. Another hack includes turning a hydration bladder into a lantern. In this hack, a light source is affixed to a bottom of the bladder, which is filled with liquid. The light is then diffused through the liquid, which acts as a lantern. The light is attached to the bladder by threading two ends of a band through the bladder and cinching ends of the band tight.

It is clear that the outdoor community desires an alternative to large cumbersome lanterns. Given the current alternatives to the large lanterns, there exists a need for more efficient alternatives.

SUMMARY

Some embodiments of the invention provide a lantern system including a lantern base and a lantern shade configured to be removably coupled to the lantern base, the lantern shade comprising at least one side wall, the at least one side wall comprising at least one portion with light diffusing properties and at least one portion with light concentrating properties and a fastener for removably coupling at least a portion of the lantern shade to the lantern base, wherein the lantern base includes at least one leg configured for attachment of a strap of a headlamp to the base.

Some embodiments of the invention provide a lantern system including a lantern base and a lantern shade configured to be removably coupled to the lantern base, the lantern shade comprising first and third side walls opposite one another, the first and second side walls having light concentrating properties, second and fourth side walls opposite one another and extending between the first and third side walls, the second and fourth side walls having light diffusing properties, and first and second tabs extending outwardly from ends of either the first and third side walls or the second and fourth side walls, the first and second tabs including first and second fasteners, wherein the lantern base includes third and fourth fasteners positioned on a lower surface of the lantern base, the first and second fasteners being configured to couple with the third and fourth fasteners to attach the lantern shade to the lantern base.

DETAILED DESCRIPTION

Figure 1:
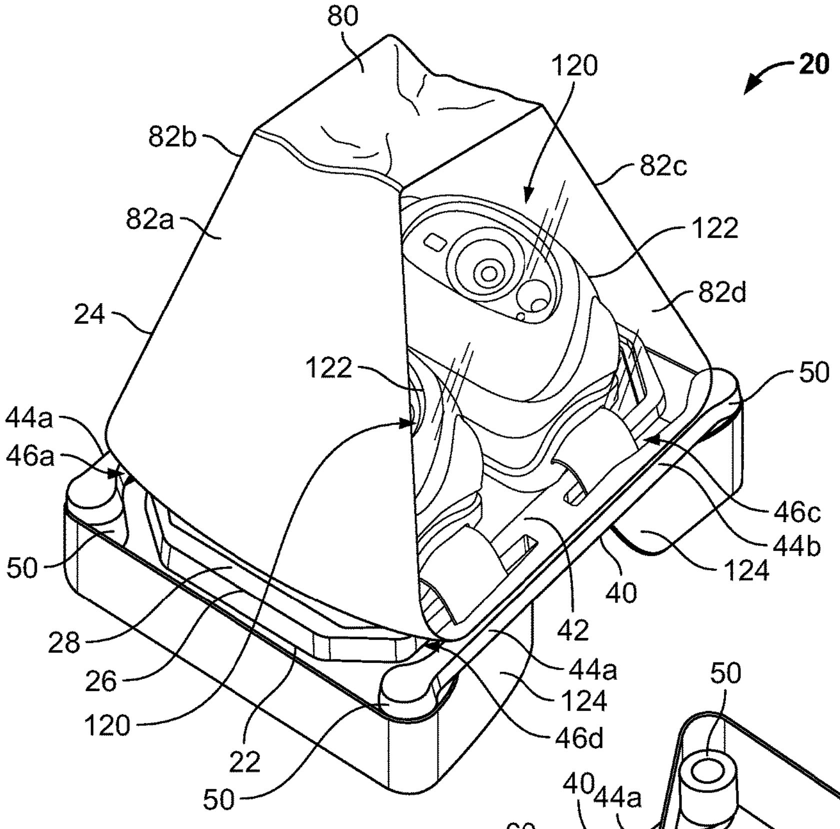
FIG. 1 is a top perspective view of an illustrative embodiment of a lantern system of the present invention in an assembled state.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Embodiments of the invention provide a lantern system for use, for example, in outdoor environments. More specifically, embodiments of the invention provide a lantern system comprising a lantern base and a lantern shade attached to the base and configured to enclose at least one headlamp to provide diffused light. The lantern system is compact and also provides a user with other tools, for example, a lens to start a fire and a mirror that can be used to view oneself and to reflect light from the at least one headlamp.

Figure 2:
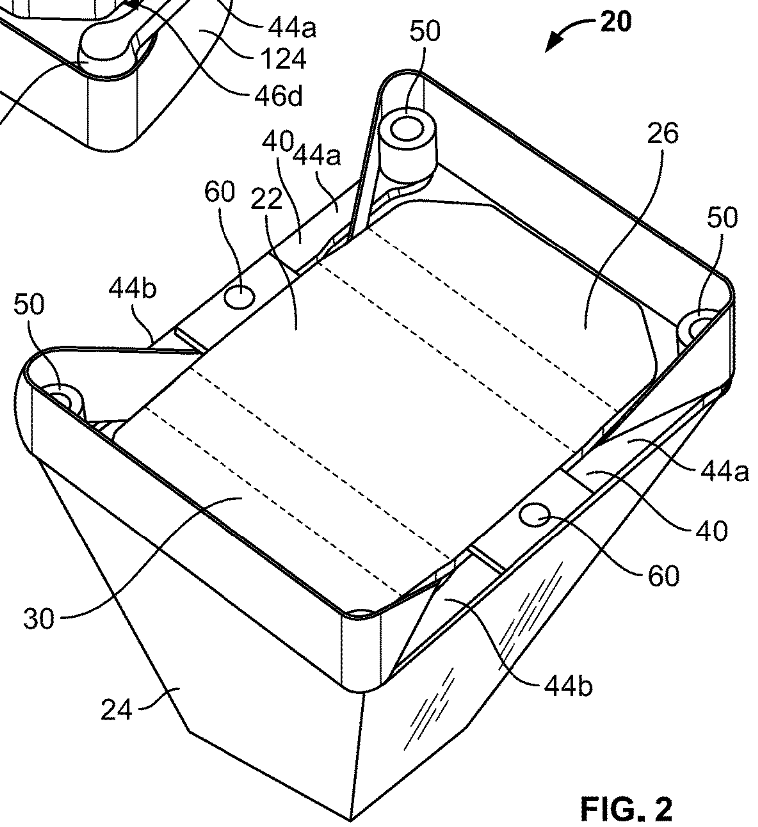
FIG. 2 is a bottom perspective view of the lantern system of FIG. 1.
Figure 3:
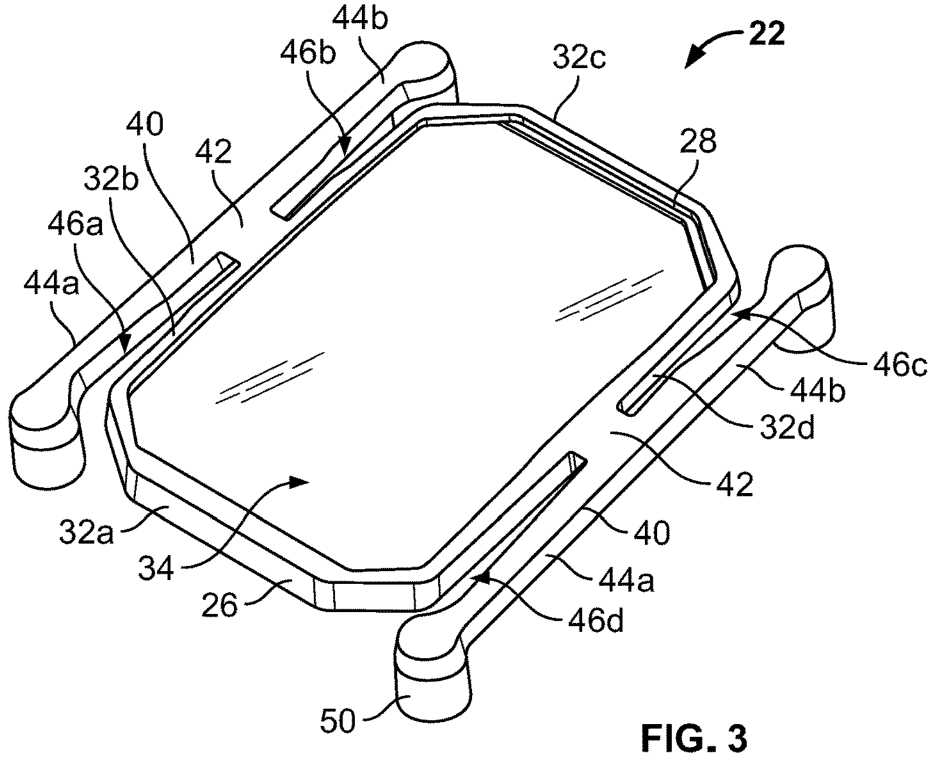
FIG. 3 is a top perspective view of a lantern base of the lantern system of FIG. 1.

FIGS. 1 and 2 depict an exemplary embodiment of a lantern system 20 in an assembled state. The lantern system 20 generally includes a lantern base 22 and a lantern shade 24. As seen in FIGS. 1-4, the lantern base 22 may include a central portion 26 having a top surface 28 and a bottom surface 30 extending between first and second opposing side surfaces 32*a*, 32*c* and third and fourth opposing side surfaces 32*b*, 32*d*. While the lantern base 22 is shown as being generally rectangular in shape (with truncated corners), the lantern base 22 may have any suitable shape or shapes. The top surface 28 of the central portion 26 may include a mirror 34, for example, in the form of a sticker or other non-breakable and lightweight mirrored surface. The lantern base 22 further includes two legs 40 joined to the central portion 26 by connecting portions 42. Each of the legs 40 includes a first leg portion 44*a* extending to a first side of the respective connecting portion 42 and a second leg portion 44*b* extending to a second side of the respective connecting portion 42. In illustrative embodiments, the legs 40 are generally parallel to the third and fourth opposing side surfaces 32*b*, 32*d* of the central portion 26 such that slots 46*a*-46*d* are formed between the leg portions 44*a*, 44*b* and the central portion 26, the function of which will be described in more detail hereinafter. The lantern base 22 may be made out of any number of lightweight materials, for example, one or more polymers, carbon fiber, and/or any other suitable materials.

Figure 4:
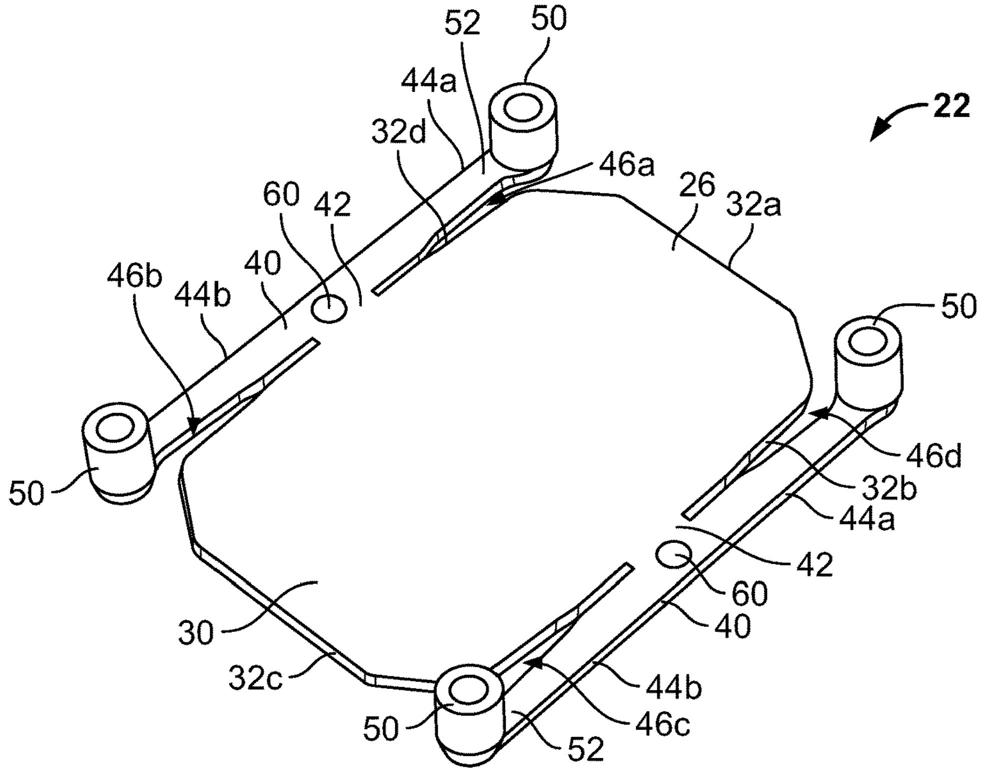
FIG. 4 is a bottom perspective view of the lantern base of FIG. 3.

With reference to FIG. 4, each of the leg portions 44*a*, 44*b* includes a foot 50 extending from bottom surfaces 52 thereof. In some embodiments, the feet 50 are positioned at ends of the leg portions 44*a*, 44*b*, but alternatively, may be positioned at any location on the bottom surfaces 52 of the leg portions 44*a*, 44*b* (or the central portion 26). The feet 50 provide support for the lantern system 20 on uneven surfaces, such as rocks. Additionally, while four feet 50 are shown, any number of feet may be utilized. In some embodiments, the feet 50 are hollow to reduce an overall weight of the base 22, thereby adding to the portability of the overall lantern system 20. Magnets 60 may also be embedded within or otherwise attached to the bottom surfaces 52 of the legs 40, for example, adjacent the connecting portions 42. Alternatively, the magnets 60 may be embedded within or otherwise attached to the bottom surface 30 of the central portion 26. The function of the magnets 60 will be discussed in greater detail below.

Figure 5:
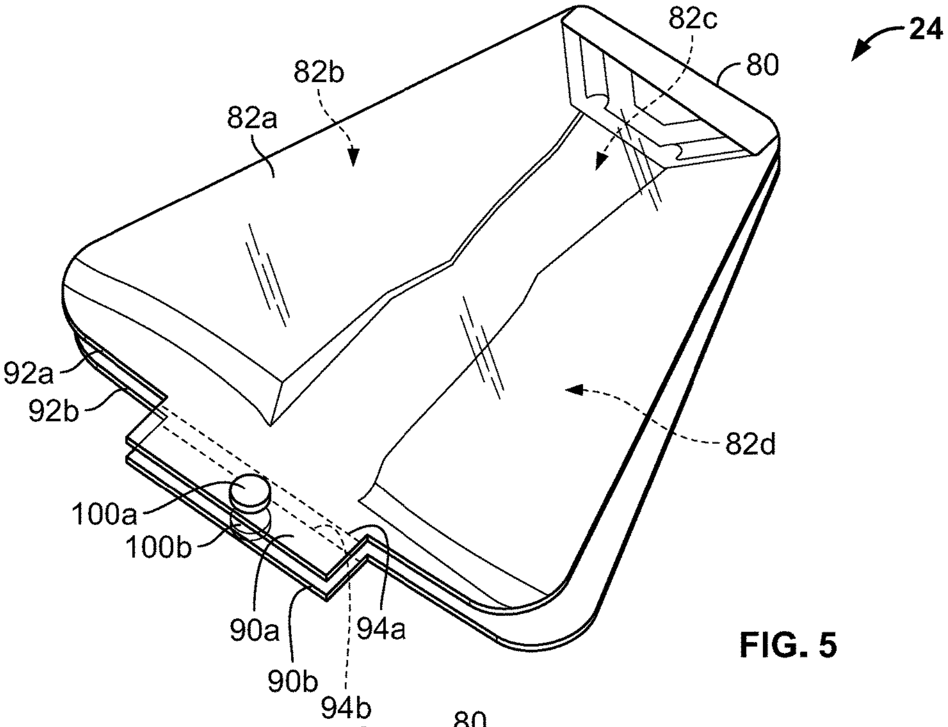
FIG. 5 is a perspective view of a lantern shade of the lantern system of FIG. 1, the lantern shade being in a folded, collapsed, or storage state.
Figure 6:
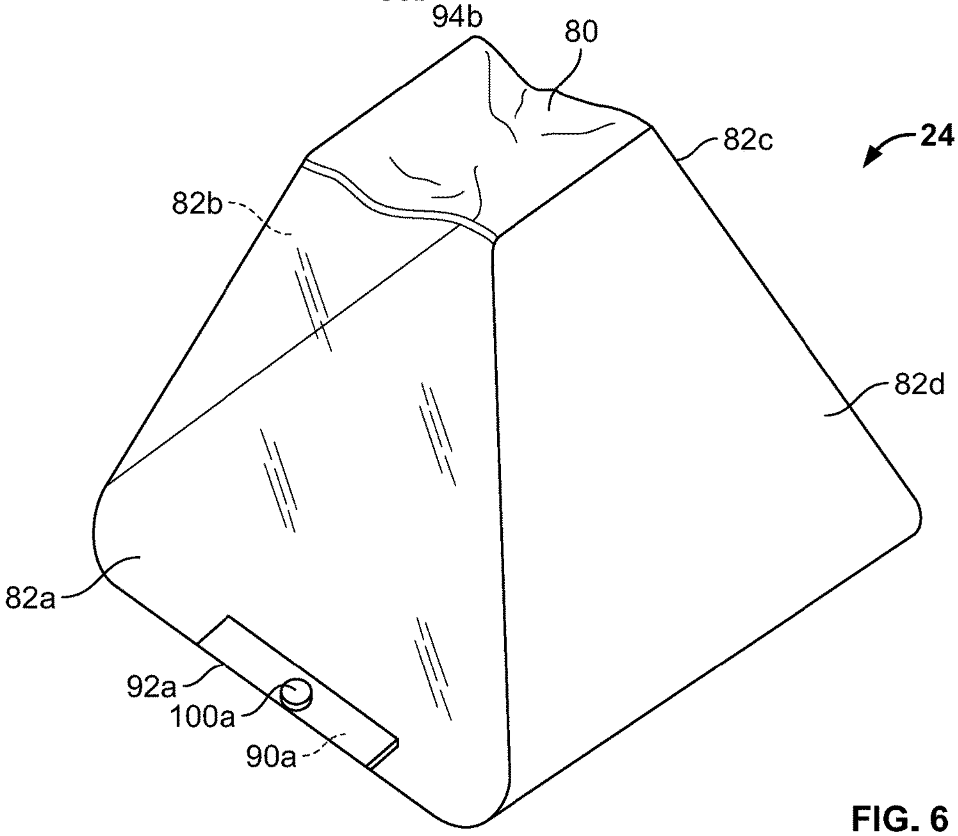
FIG. 6 is a top perspective view of the lantern shade of FIG. 5 in an erected or assembled state.

Referring now to FIGS. 5 and 6, the lantern shade 24 is shown in a collapsed condition and an assembled state, respectively. In illustrative embodiments, the lantern shade 24 is generally pyramidal in shape with a truncated top 80. More particularly, the lantern shade 24 includes first, second, third, and fourth planar and angled side walls 82*a*-82*d* with the first and third side walls 82*a*, 82*c* being opposite one another and the second and fourth side walls 82*b*, 82*d* being opposite one another. In illustrative embodiments, the first and third side walls 82*a*, 82*c* are made of a light concentrating material, for example, each side wall 82*a*, 82*c* may be made of one or more sections of lens material (e.g., Fresnel lenses), for example, the entire side wall 82*a*, 82*c* may be made of a single lens or multiple lenses. In some embodiments, the side walls 82*a*, 82*c* may be made exclusively of one lens each and/or one or more side, bottom, and/or top edges of the lenses may be bent, for example, to attach to the side walls 82*b*, 82*d* or the truncated top 80. Not only do the sections of lens material provide light concentrating properties, but they also provide a means for starting a fire. More particularly, the sections of lens material concentrate light from the sun into a beam capable of starting a fire. The sections of lens material may also act as a magnifying glass for inspecting insects, leaves, or other objects. In illustrative embodiments, the second and fourth side walls 82*b*, 82*d* are made of a light diffusing material, for example, a fabric, a frosted silicone, a frosted plastic, an opaque material, or any other light diffusing material. In some embodiments, the fabric or other material of the second and fourth side walls 82*b*, 82*d* may be treated with a stiffening agent to make folding (as discussed below) more predictable. In some embodiments, the fabric or other material of the second and fourth side walls 82*b*, 82*d* may be alternatively or additionally treated with a luminous (e.g., glow-in-the-dark) agent that makes the lantern shade 24 glow so the lantern system 20 can be found easily in the dark (e.g., when the lantern system 20 is not illuminated). While the side walls 82*a*-82*d* are shown and discussed as being made of particular materials, the materials of each of the side walls 82*a*-82*d* may be varied, so long as at least one of the side walls 82*a*-82*d* is made of a light concentrating material and one of the side walls 82*a*-82*d* is made of a light diffusing material. Still further, while the lantern shade 24 is shown as being pyramidal in shape with four side walls, the lantern shade 24 may have any suitable shape and/or may have any suitable number of side walls. For example, the lantern shade 24 may have one or more side walls. In the case of the lantern shade 24 having only a single side wall, the lantern shape 24 would be generally conical in shape. In some embodiments, if the shape of the lantern shade 24 is a different shape (other than pyramidal), the lantern base 22 may have a similar or different shape.

Still referring to FIGS. 5 and 6, the lantern shade 24 further includes first and second tabs 90*a*, 90*b* extending outwardly from bottom ends 92*a*, 92*b* of the first and third side walls 82*a*, 82*c*. Alternatively, the tabs 90*a*, 90*b* could extend outwardly from bottom ends of the second and fourth side walls 82*b*, 82*d*. The tabs 90*a*, 90*b* are connected to the first and third side walls 82, 82*c* by flexible joints 94*a*, 94*b*, for example, areas of thinned material, score lines, or any other feature that provides for a flexible joint. The flexible joints 94*a*, 94*b* allow the tabs 90*a*, 90*b* to be folded inwardly and outwardly, as desired. Magnets 100*a*, 100*b* are positioned on the tabs 90*a*, 90*b*, for example, in a middle portion of the tabs 90*a*, 90*b* (or any other suitable location). In some embodiments, the magnets 100*a*, 100*b* are secured to inner surfaces of the tabs 90*a*, 90*b*. In other illustrative embodiments, the magnets 100*a*, 100*b* are positioned in apertures (not shown) within the tabs 90*a*, 90*b* such that the magnets 100*a*, 100*b* are accessible on both inner and outer surfaces of the tabs 90*a*, 90*b*.

Figure 7:
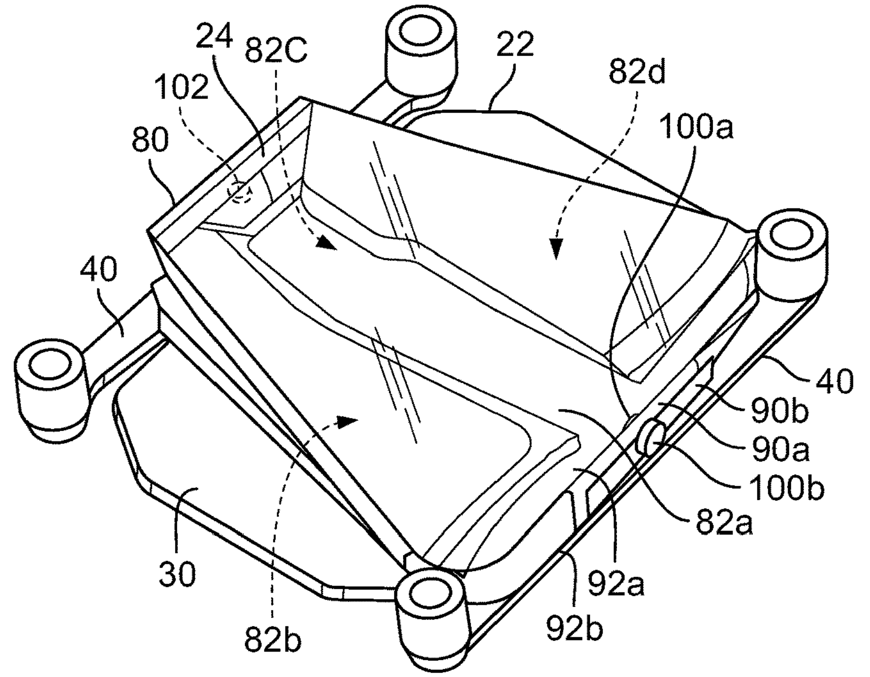
FIG. 7 is a bottom perspective view of the lantern system of FIG. 1 in a collapsed state with the lantern shade attached to a bottom of the lantern base.

The truncated top 80 of the lantern shade 24 may also be made of a light diffusing material or any other suitable material. In some embodiments, the material of the truncated top 80 may be formed, either in whole or in part, of a reflective material that reflects light from lights or headlamps within the lantern system 20 back down and out the lens material of the first and third side walls 82*a*, 82*c*. One or more magnets 102, as best seen in FIG. 7, may positioned at a top portion of the lantern shade 24, for example, within the truncated top portion 80 or at any other suitable location. The function of the magnet(s) 102 will be discussed in greater detail below.

Figure 8:
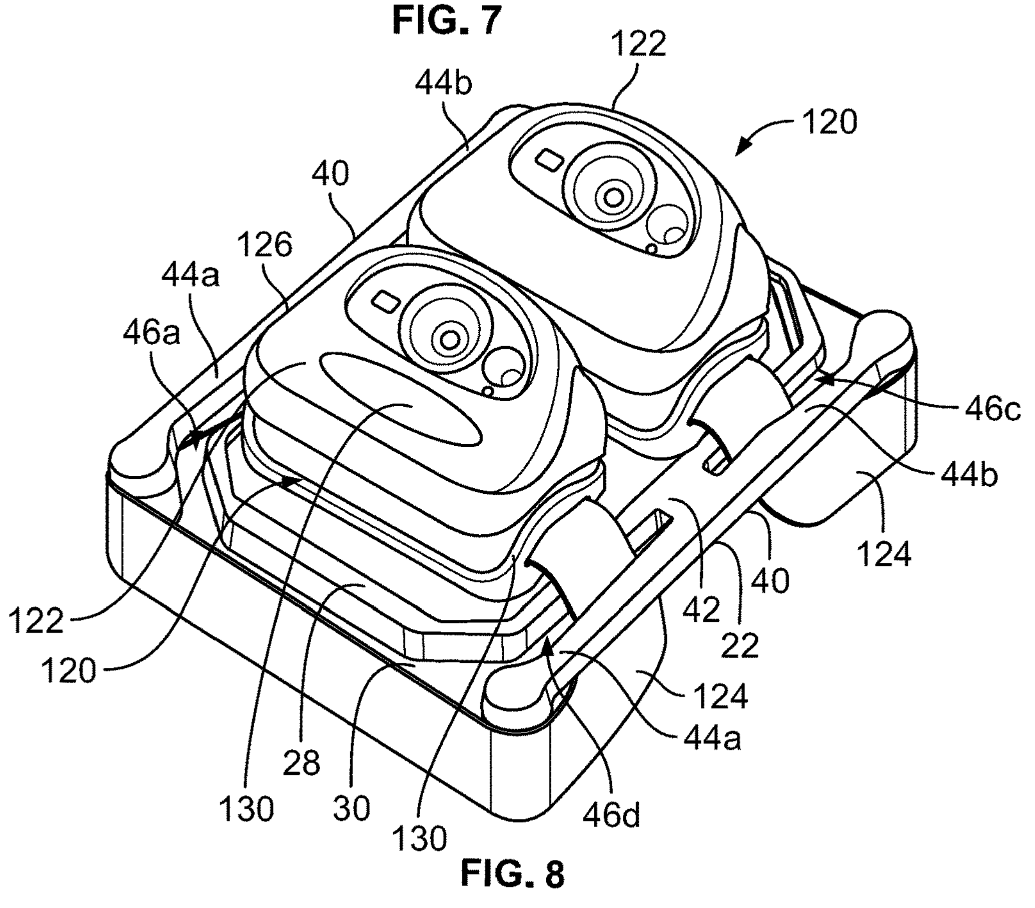
FIG. 8 is a top perspective view of the lantern system of FIG. 1 with the lantern shade removed therefrom.

As best seen in FIGS. 5 and 8, the lantern shade 24 may be collapsed to create a more compact lantern system 20 for storage and portability. More particularly, the second and fourth side walls 82*b*, 82*d* of the lantern shade 24 may be generally flexible, as described above. The second and fourth side walls 82*b*, 82*d* may therefore be folded inwardly such that the more rigid first and third side walls 82*a*, 82*c* form outer surfaces of the collapsed lantern shade 24. As seen in FIG. 8, when the lantern shade 24 is in a collapsed state, the lantern base 22 may be turned over and the collapsed lantern shade 24 may be removably coupled to a bottom of the lantern base 22. More particularly, the magnets 100*a*, 100*b* on the tabs 90*a*, 90*b* may be removably coupled to one of the magnets 60 within the bottom surface 52 or 62 of the legs 40 or central portion 26, respectively. The magnet(s) 102 in the top portion of the lantern shade 24 is removably coupled to the other of the magnets 60. In this manner, the lantern base 22 and the lantern shade 24 may be secured to one another when not in use to keep the components together.

FIGS. 1, 2, and 7 depict a method of assembling the lantern system 20. As seen in FIG. 7, one or more headlamps 120 may be attached to the lantern base 22. The headlamps 120 generally include a lamp portion 122 with a strap 124 attached to the headlamp portion 122. A portion of the strap 124 extending from a first side 126 of the headlamp 120 is inserted through a first of the slots 46*a* and a portion of the strap 124 extending from a second side 130 of the headlamp 120 is inserted through another of a second of the slots 46*d* opposite the first of the slots 46*a*. The strap 124 is then either wrapped around the bottom surface 62 of the central portion 26 (shown in FIG. 2 in dashed lines) or around the feet 50 (as seen in FIGS. 1, 2, and 7 in solid lines). If a second headlamp 120 is utilized, the strap 124 is similarly inserted into the slots 46*b*, 46*c* and wrapped around the bottom surface 62 of the central portion 26 or around the feet 50. In illustrative embodiments, the headlamps 120 are positioned with a power button 130 of the headlamp 120 facing outwardly for easy access through the lantern shade 24, as discussed more below. While embodiments with one or two headlamps 120 are depicted and discussed herein, it is possible to include any suitable number of headlamps 120, in which case, the shape of the lantern base 22 and/or the number of leg portions may be varied to accommodate additional headlamps 120. Still further, while a particular headlamp 120 is depicted, the lantern systems disclosed herein may be utilized with any type of headlamp (or other lighting device).

Once the headlamps 120 are attached to the lantern base 22, the lantern shade 24 is removed from the bottom surface 62 of the central portion 26 and is attached to the base 22 over the headlamps 120. More particularly, the lantern shade 24 is positioned with the tabs 90*a*, 90*b* adjacent the legs 40. The tabs 90*a*, 90*b* are thereafter wrapped around the legs and the magnets 100*a*, 100*b* are secured to the magnets 60 to attach the lantern shade 24 to the lantern base 22 with the headlamps 120 positioned therebetween. In this manner, the headlamp power buttons 130 are accessible through the lantern shade 24 to turn the headlamps 120 on and off, as desired.

When the headlamps 120 are turned on, light from the headlamps 120 is diffused through the second and fourth side walls 82*b*, 82*d* to create a soft light on a vertical axis and the light is emitted through the lenses of first and third side walls 82*a*, 82*c* to concentrate the light into a strong beam and spread light horizontally. The light is also reflected off of the mirror 34 to intensify the light emitted through the side walls 82*a*-82*d*. The side walls 82*a*-82*d*, as a whole, both concentrate, soften, and diffuse light emitted by the headlamps 120 to provide an ultra-bright, non-abrasive, ambient light that provides a greater distance of visibility than a headlamp 120 alone.

In use, the lantern system 20 may be inverted and hung by the straps 124 of the headlamp 120, for example, by a tree branch, a tent loop, or any other structure. In such a use, the straps would have to be removed from the legs (if wrapped around the legs) and utilized to suspend the lantern system 20.

When not in use, the lantern shade 24 compacts down to store beneath the lantern base 22. The compact and lightweight storage design saves weight and volume for storage and transport by campers.

In some embodiments of the present invention, the lantern systems 20 disclosed herein may weigh less than 200 grams, less than 150 grams, or less than 130 grams and may take up less than 200 square centimeters, less than 175 square centimeters, or less than 140 square centimeters in its collapsed state. For campers, this means they need not pack a big, heavy lantern, but still can achieve the lighting of such a lantern.

While the present invention is described as having magnets at different locations, one skilled in the art will understand that different fastening mechanism may be utilized in place of any of the magnets disclosed herein, for example, adhesives, Velcro®, or any other fasteners that would allow parts to be coupled and de-coupled from one another.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein. Various features and advantages of the invention are set forth in the following claims.

The invention claimed is:

1. A lantern system, comprising:
- a lantern base; and
- a lantern shade configured to be removably coupled to the lantern base, the lantern shade comprising:
  - at least one side wall, the at least one side wall comprising at least one portion with light diffusing properties and at least one portion with light concentrating properties; and
  - a fastener for removably coupling at least a portion of the lantern shade to the lantern base; wherein the lantern base includes at least one leg configured for attachment of a strap of a headlamp to the lantern base.

2. The lantern system of claim 1, wherein:
- the lantern shade has first, second, third, and fourth side walls,
- the lantern shade is pyramidal,
- the first and third side walls are opposite one another and have light concentrating properties, and
- the second and fourth side walls are opposite one another and have light diffusing properties.

3. The lantern system of claim 2, wherein a top portion of the lantern shade is truncated, thereby creating a top wall that is generally parallel to a top surface of the lantern base when the lantern system is assembled, the top wall including reflective properties for reflecting light downwardly.

4. The lantern system of claim 2, wherein the second and fourth side walls are treated with a stiffening agent.

5. The lantern system of claim 1, wherein at least one first magnet is positioned on a lower surface of the lantern base and at least one second magnet is positioned at a lower end of the lantern shade and the at least one second magnet is configured to be removably coupled to the at least one first magnet when the lantern system is assembled.

6. The lantern system of claim 5, wherein a third magnet is positioned in a top portion of the lantern shade.

7. The lantern system of claim 6, wherein, during storage of the lantern system, the at least one first magnet includes two magnets positioned on a lower surface of the lantern base and a collapsed lantern shade is configured to be attached to the lower surface of the lantern base with the at least one second magnet removably coupled to one of the at least one first magnet and the third magnet is configured to be removably coupled to another of the at least one first magnet.

8. The lantern system of claim 1, wherein lantern base includes first and second legs spaced from and coupled to first and second sides of a central portion, thereby forming slots between the first and second sides and the first and second legs.

9. The lantern system of claim 8, wherein the slots are configured to accept a strap of a headlamp such that the headlamp can be placed on an upper surface of the lantern base and the lantern shade can be placed over the lantern base to holding the headlamp therebetween.

10. The lantern system of claim 1, wherein a mirror is positioned on at least a portion of an upper surface of the lantern base.

11. The lantern system of claim 1, wherein at least a portion of the lantern shade is treated with a luminous agent.

12. A lantern system, comprising:

a lantern base; and a lantern shade configured to be removably coupled to the lantern base, the lantern shade comprising:

first and third side walls opposite one another, the first and third side walls having light concentrating properties;

second and fourth side walls opposite one another and extending between the first and third side walls, the second and fourth side walls having light diffusing properties;

first and second tabs extending outwardly from ends of either the first and third side walls or the second and fourth side walls, the first and second tabs including first and second fasteners;

wherein the lantern base includes third and fourth fasteners positioned on a lower surface of the lantern base, the first and second fasteners being configured to couple with the third and fourth fasteners to attach the lantern shade to the lantern base.

13. The lantern system of claim 12, wherein the first, second, third, and fourth fasteners are magnets.

14. The lantern system of claim 13, further comprising a fifth fastener positioned within a top portion of the lantern shade wherein:

the first, second, third, fourth, and fifth fasteners respectively include first, second, third, fourth, and fifth magnets, and when the lantern shade is collapsed, the first and second fasteners are removably coupled to one of the third and fourth fasteners and the fifth fastener is removably coupled to the other of the third and fourth fasteners.

15. The lantern system of claim 12, wherein the lantern shade further includes:

a first leg coupled to a first side of a lantern base central portion, the first leg having first and second portions spaced from the first side of the lantern base central portion to create first and second slots therebetween; and a second leg coupled to a second side of the lantern base central portion opposite the first side, the second leg having third and fourth portions spaced from the second side of the lantern base central portion to create third and fourth slots therebetween;

wherein the first and fourth slots are configured to accept a first strap of a first headlamp and the second and third slots are configured to accept a second strap of a second headlamp such that first and second lights of the first and second headlamps, respectively, rest on a top surface of the lantern base with the first and second lights positioned between the lantern shade and the lantern base.

16. The lantern system of claim 15, wherein the lantern shade is configured such that power buttons of at least one of the first and second headlamps is accessible through the second or fourth side walls of the lantern shade.

17. The lantern system of claim 12, wherein:

a mirror is positioned on at least a portion of an upper surface of the lantern base, the mirror reflecting light upwardly;

a top portion of the lantern shade is truncated, thereby creating a top wall that is generally parallel to a top surface of the lantern base when the lantern system is assembled, the top wall including reflective properties for reflecting light downwardly; and the mirror and the top portion act to emit light through the first, second, third, and fourth side walls.

18. The lantern system of claim 12, wherein at least one of the first, second, third, and fourth side walls includes a luminous agent.

19. The lantern system of claim 12, wherein the second and fourth side walls are treated with a stiffening agent.

* * * * *